United States Patent [19]
Walsh

[11] 3,964,957
[45] June 22, 1976

[54] APPARATUS FOR PROCESSING SEMICONDUCTOR WAFERS

[75] Inventor: Robert J. Walsh, Ballwin, Mo.
[73] Assignee: Monsanto Company, St. Louis, Mo.
[22] Filed: Sept. 30, 1974
[21] Appl. No.: 510,851

Related U.S. Application Data
[62] Division of Ser. No. 426,387, Dec. 19, 1973, abandoned.

[52] U.S. Cl. .............................. 156/345; 134/108; 134/159; 156/17
[51] Int. Cl.² ........................................ H01L 7/50
[58] Field of Search ........... 134/107, 108, 140, 157, 134/159, 201, 32, 33, 165; 156/17, 345

[56] References Cited
UNITED STATES PATENTS

| | | | |
|---|---|---|---|
| 1,104,139 | 7/1914 | Rodda | 134/159 X |
| 3,632,462 | 1/1972 | Barrington | 156/345 |
| 3,679,517 | 7/1972 | Schulten et al. | 156/345 |
| 3,869,313 | 3/1975 | Jones et al. | 156/345 X |

OTHER PUBLICATIONS
IBM Technical Disclosure Bulletin, Vol. 8 No. 12, May 1966, p. 1845, Semiconductor Wafer Handling Apparatus for Chemical Etching Operations by C. E. Hallas, Jr.

*Primary Examiner*—William A. Powell
*Attorney, Agent, or Firm*—Peter S. Gilster

[57] ABSTRACT

Circular wafers of semiconductor (silicon) are chemically treated, e.g., etched, by supporting the wafers vertically by contacting their edges with annularly grooved drive rollers, immersing the supported wafers in a body of chemical medium (e.g., etchant solution) for treatment, and rotating the wafers by rotation of the drive rollers while the wafers are immersed in the body of medium to uniformly and precisely treat the surfaces of the wafers. Apparatus for effecting such precision etching includes an etchant tank, a wafer rack including the drive rollers which support the edges of the wafers in vertical face-to-face relationship, the rack being lowered into the etchant to immerse the wafers. Means is disclosed for rotating the drive rollers for rotation of the immersed wafers and provision is included for circulating the etchant for causing uniform flow thereof past the rotating wafers. A heat exchanger maintains the etchant substantially at a predetermined temperature.

11 Claims, 6 Drawing Figures

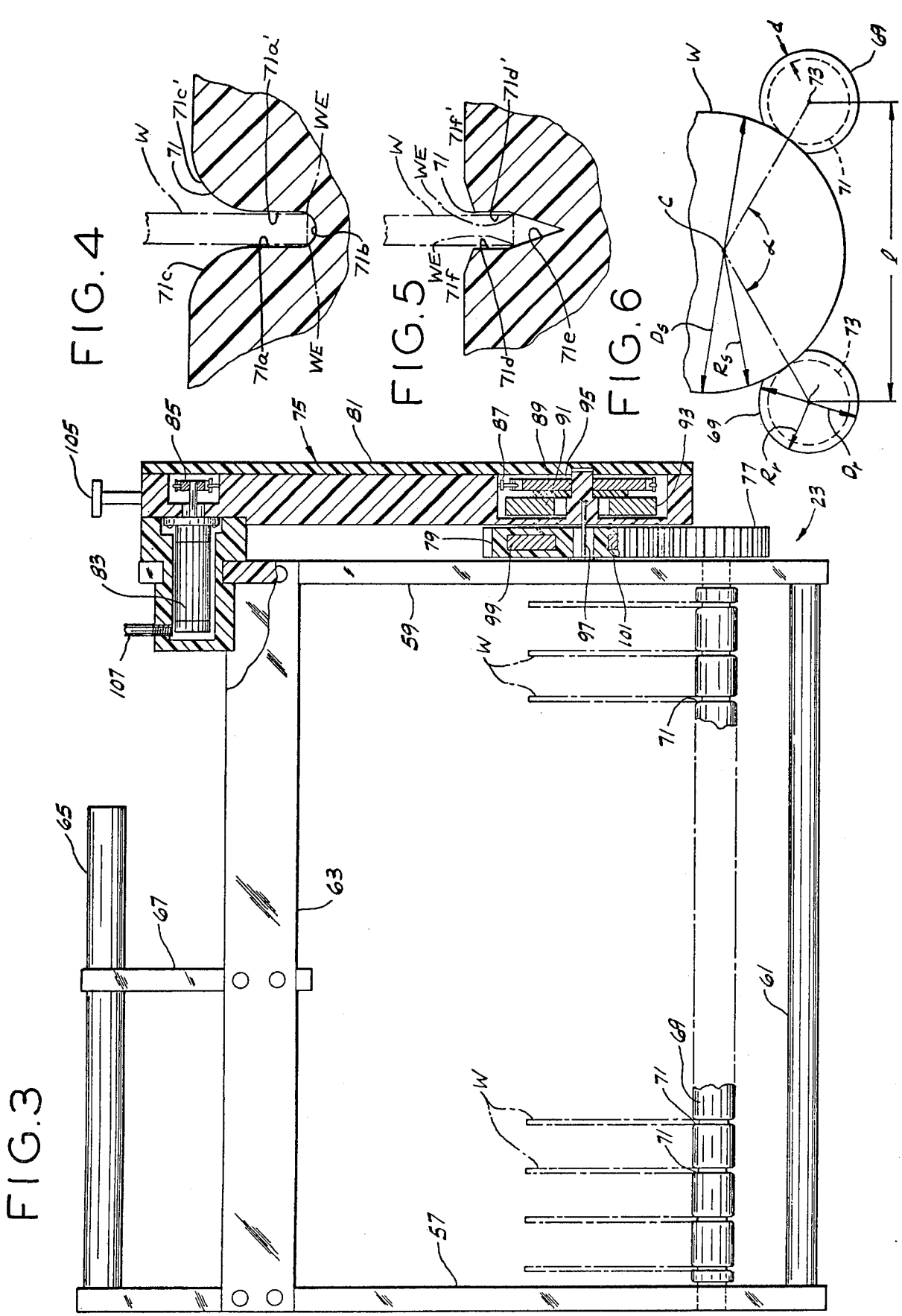

APPARATUS FOR PROCESSING SEMICONDUCTOR WAFERS

This is a division, of application Ser. No. 426,387 filed Dec. 19, 1973, now abandoned.

BACKGROUND OF THE INVENTION

The present invention relates to improved methods and apparatus for chemical treatment of wafer, and particularly to improved methods and apparatus for precision bright etching of semiconductor wafers, i.e., acid etching of circular silicon wafers.

Sawed, lapped or ground silicon slices (wafers) are chemically etched primarily for the purpose of removing surface layers in which the crystals lattice structure has been disturbed by the preceeding rough mechanical shaping operation. Such damage, if not removed, can result in serious degradation of the bulk crystal structure in subsequent thermal treatment. In addition to removing damage, etching provides the additional benefits of:

1. A reduction in the mechanical distortion (bow) of the wafer caused by a difference in damage-induced stress on the two surfaces of the wafer;
2. Rounding of sharp wafer edges;
3. Improved cleanliness and ability to clean wafers; and
4. Improved wafer strength.

The latter two benefits are the result of elimination of surface cracks which are believed to harbor debris and serve as stress concentration points.

Mixtures of concentrated nitric acid, hydrofluoric acid and acetic acid are most often used in silicon etching. The nitric and hydrofluoric acids enter into the etching reaction directly as shown below in equation (1) while the acetic acid is added as a diluent which slows the reaction rate but improves the etched surface appearance (smoothness).

$$3Si + 4HNO_3 + 18HF \rightarrow 3H_2SiF_6 + 4NO + 8H_2O \qquad (1)$$

Bright etching (or "etch polishing") occurs when relatively low concentrations of HF are employed so that the etching rate is limited by the rate of diffusion of HF to the silicon surface. This results in a selective attack on high points (probably because they extend into the diffusion gradient region) and produces a surface smoothing action. At higher HF concentrations, the attack is not selective and a dull or "flat" finish is produced.

Etching of slices by the prior art "bucket" or "tumble" etching method has always been characterized by a high degree of variability of stock removal both within batches (95% ± 0.3 mil) and between batches (95% ± 0.70 mils).

The within-batch variation is attributed largely to wafer-to-wafer differences in surface damage as well as failure to keep wafers completely separated by the manual agitation techniques typically employed.

The overriding factor in batch-to-batch variation appears to be the effect of temperature. The etching reaction is strongly exothermic, liberating 6150 calories per gram of silicon dissolved. Under the normal bucket etching conditions, this corresponds to an etchant temperature rise of about 64°F for the nominal two-mil removal (or 128°F rise for four-mil removal). As a result, the instantaneous etching rate is 3–4 times higher near the end of the run than at the beginning, making timing very critical. Also, for a fixed etching time, the total stock removal can vary considerably depending on the rate of temperature rise of the system. This, in turn, depends on the initial etch rate (which is affected by the starting temperature and degree of surface damage), the agitation, and the ratio of etchant volume to slice area. In the prior art, these factors have not been closely controlled.

Other problems with the prior art etching process include:

1. staining;
2. high acid usage;
3. poor within-wafer thickness uniformity;
4. possibility of scratch damage through wafer contact during and after etching;
5. high peak loads on fume scrubbing equipment; and
6. excessive dilution of the spent etchant reduces efficiency of fluoride precipitation waste disposal system.

Heretofore, in the production processing of silicon wafers, the prior art "tumble etching" process has resulted in a broad thickness distribution of etched slices. This has required that a lapping of the etched wafers be carried out prior to finish polishing. Since there is a potential for significant yield and labor cost improvement in the polishing of wafers if the standard lapping step can be eliminated, it is desired that the etching technique provide improved thickness control in etching of the sliced silicon wafers.

SUMMARY OF THE INVENTION

Among the objects of the present invention may be noted the provision of improved methods and apparatus for chemical treatment of circular wafers and, more particularly, for precision etching of silicon wafers; the provision of such methods and apparatus which reduce or eliminate staining, high acid usage, scratch damage through wafer contact during and after etching, high peak loads on fume scrubbing equipment, and excessive dilution of spent etchant; the provision of such methods and apparatus which provides for the capability of etching sawed or lapped slices to close thickness tolerances even though starting thickness distribution may be very broad; the provision of such methods and apparatus which provide for close control of stock removal within and between wafers in an etching run and also from run to run; the provision of such methods and apparatus providing improved "edge-rounding" of wafers; and the provision of such methods and apparatus which provide for greatly increased yields in the processing and polishing of silicon wafers and which permit a substantial reduction in labor.

Briefly, the invention involves a method of chemical treatment of circular wafers, such as silicon, comprising supporting at least one such wafer vertically by contacting its edge with drive roller means, immersing the supported wafer in a body of a chemical medium for treatment thereof, and rotating the wafer by rotation of the drive roller means in the body of chemical medium thereby to uniformly and precisely treat the surfaces of the wafer. The chemical medium disclosed is an acid etchant, the wafers being slices of silicon.

This utilizes apparatus comprising an etchant tank, a wafer rack including plurality of rollers, each of the rollers having annular grooves which support the edges of a plurality of wafers in vertical face-to-face relationship. The rack is adapted to be lowered into the etchant tank for immersion of the wafers in the etchant. Means is included for rotating the drive rollers for rotation of the immersed wafers. Provision is made for circulating the etchant for causing uniform flow thereof past the rotating wafers, and a heat exchanger is included for maintaining the etchant substantially at a predetermined temperature.

Other objects and features will be in part apparent and in part pointed out hereinafter.

BRIEF DESCRIPTION OF THE DRAWINGS

FIG. 3 is a horizontal plan view of the wafer rack of FIG. 2 including a roller drive assembly of the invention shown in cross-section;

FIG. 4 is an enlarged cross-section of a roller groove of one preferred configuration;

FIG. 5 is an enlarged cross-section of a roller groove of another preferred configuration; and FIG. 6 is a plan view illustrating the geometry of rollers of the wafer rack of FIG. 2 in relation to a wafer supported by the rollers.

Corresponding reference characters refer to corresponding parts throughout the several views of the drawings.

DESCRIPTION OF THE PREFERRED EMBODIMENT

Figure 1:
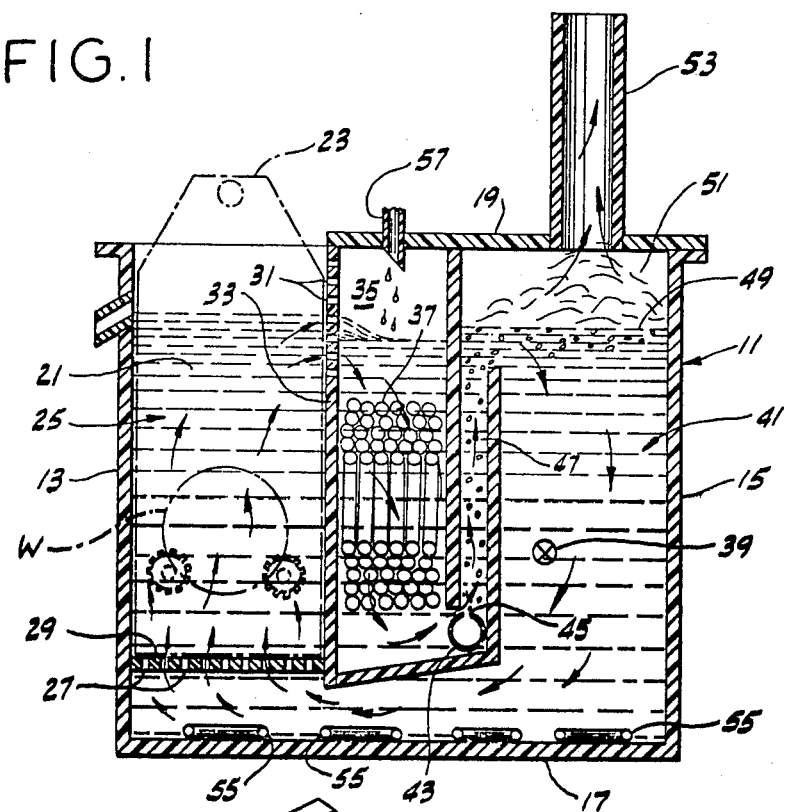
FIG. 1 is a horizontal cross-section of apparatus of the invention.

Referring now to FIG. 1, an etching tank of the invention is illustrated generally at 11. The etching tank is of generally rectangular construction and, in the interest of simplicity, is shown only in cross-section. That is, tank 11 contains side walls 13 and 15 and the bottom wall 17 as well as a cover 19 covering a portion of the top surface of the tank. End walls which are not shown extend tranversely across the ends of the tank and are of the same configuration and thickness as side wall 15.

The etching tank (including walls and various panels therein) is preferably of welded polypropylene construction, this material being relatively uneffected by the acid etchant. Other materials of construction suitable for exposure to mixed acid silicon etchant solutions containing nitric, hydrofluoric and acetic acids include fluorocarbons, such as those sold under the trade names Teflon TFE, Teflon FEP, Kel-F, Kynar and Tefzel; polyvinylchoride (PVC); and low or high density polyethylene. Various tube fittings of plain or glass-filled polypropylene have been found to be satisfactory.

Etching tank 11 contains four main zones or compartments separated by panels or internal walls which extend the length of the etching tank, i.e., between the end walls. At 21 is indicated a wafer etching chamber adapted to have lowered into it a wafer etching rack which is indicated generally at 23 in FIG. 2. Wafer rack 23 is shown in phantom in FIG. 1. During etching, acid etchant indicated generally at 25 is circulated through etching chamber 21 in uniform laminar flow from apertures 27 of a perforated panel 29 constituting a bottom wall of etching chamber 21. The etchant flows upward through chamber 21 and then through apertures 31 of another panel, 33 constituting a side wall of chamber 21. Panel 33 with its apertures 31 serves as an overflow weir over which the etchant flows into a heat exchanger chamber 35.

During etching of the wafers such as that designated at W which are supported by wafer rack 23, the etchant is warmed slightly. In order to prevent the body of etchant in the tank from becoming too warm, it is cooled by a heat exchanger coil 37 constituted by a length of thin wall fluorocarbon tubing such as that sold under the trade name Teflon FEP which is suitably wound on a form or bobbin and through which cold water is circulated for cooling the etchant. In a prototype etching system which has been constructed in accordance with the present disclosure a heat exchanger having six square feet of heat transfer area was used, this heat exchanger having six 33-foot lengths of AWG-10 size tubing braided together and connected in parallel and then wound on a form to fill the entire length of tank 11. Water having a maximum temperature of 70°F. was flowed inside the tubes at a rate of 0.4 gpm when called for by a temperature collector. The temperature was sensed by a suitable temperature sensor positioned as shown at 39 located in an etchant return chamber 41.

An air-lift pump is preferably employed as a means for circulating the etchant for causing its uniform flow past the wafers W which, as will be seen, are rotated while supported by wafer racks 23. The pressure differential for circulating the etchant is provided by a sparging tube 43 which runs the full length of tank 11. About 1 SCFM of dry air is fed through numerous small apertures such as indicated at 45 along the length of sparging tube 43. The dry air is supplied to sparging tube 43 by suitable tubing (not shown) from an air supply at a pressure of 30 psig, for example. In addition to pumping the etchant, the rising air serves three other important functions:

a. it oxidizes nitric oxide produced in the etching reaction:

$$2NO + O_2 \rightarrow \rightarrow 2NO_2 \qquad (2)$$

This tends to drive the competing reaction to the left:

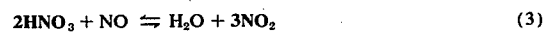
$$2HNO_3 + NO \rightleftharpoons H_2O + 3NO_2 \qquad (3)$$

conserving nitric acid and reducing the water content of the etchant;

b. it helps to strip out the more volatile components of the etchant solution. These are primarily the reaction products: NO, NO$_2$, H$_2$O, and probably H$_2$SiF$_6$. If too little stripping air is used, the concentration of reaction products builds up, the solution becomes very dark in color, "bubble tracks" may develop on the slices, the thickness uniformity may be adversely affected, and the incidence of pits and other surface irregularities increases; and c. it provides longitudinal cross mixing of the circulating etchant necessary to insure uniform temperature and acid composition along the length of the tank.

In order to maintain a steady state etchant composition, the etchant circulation air is allowed to flow only during etching runs. The run timer may be used to turn it on at the beginning and off at the end of each run automatically.

Bubbles of air thus rise from sparging tube 43 from which they are released and upward through a sparging channel 47 until they reach the surface 49 of the etchant body in a vapor discharge chamber 51. Here the gas bubbles and volatile components of the etchant solution are released. A duct 53 is provided for removing the acid fumes and vapor and carrying them to an acid scrubber. Thus purged of the vapor products and air, the acid etchant flows downward through return channel or chamber 41 which constitutes, in effect, a large cross-section duct providing low velocity downward flow of the etchant from the sparger discharge to the bottom of etchant chamber 25. Such low velocity flow allows time and space for the air bubbles to disengage from the liquid etchant. Temperature sensors for indication and control are located, as shown at 39, in this zone.

Between etching runs, heat may be required to maintain the etchant body at a predetermined temperature, such as 85°F., which is preferred for etching. Such heat is provided by turns 55 of tubing (such as the fluorocarbon Teflon) lying on the bottom wall 17 of etchant tank 11. A conventional temperature controller whose operation is controlled by sensor 39 controls the flow of heated water through the heating turns or coils 55. A suitable flow rate for the heating water is 100 ml/min.

Through use of the heat exchanger arrangement including cooling coil 37 and the heating coil 55, the etchant temperature is readily maintained at a predetermined value by sensing the temperature by sensor 39, heating the etchant by circulation of hot water through the heating coil 55 if sensed temperature incipiently falls below this value, and cooling the etchant by circulation of cold water through cooling coil 37 if the sensed temperature incipiently rises above this predetermined value, e.g., 85°F.

Because the etchant concentration changes as a result of the etching reaction, means is provided for metering fresh etchant into the body of etchant at a predetermined rate. For this purpose, an etchant metering tube 57 is provided in top wall 19 in order to drip fresh etchant into the heat exchanger zone 35. The rate of flow may be controlled by conventional means. A small air lift pump may be used for this purpose and exemplary etchant feed rates for a prototype apparatus were found to be from approximately 100 to 200 ml/min.

Figure 2:
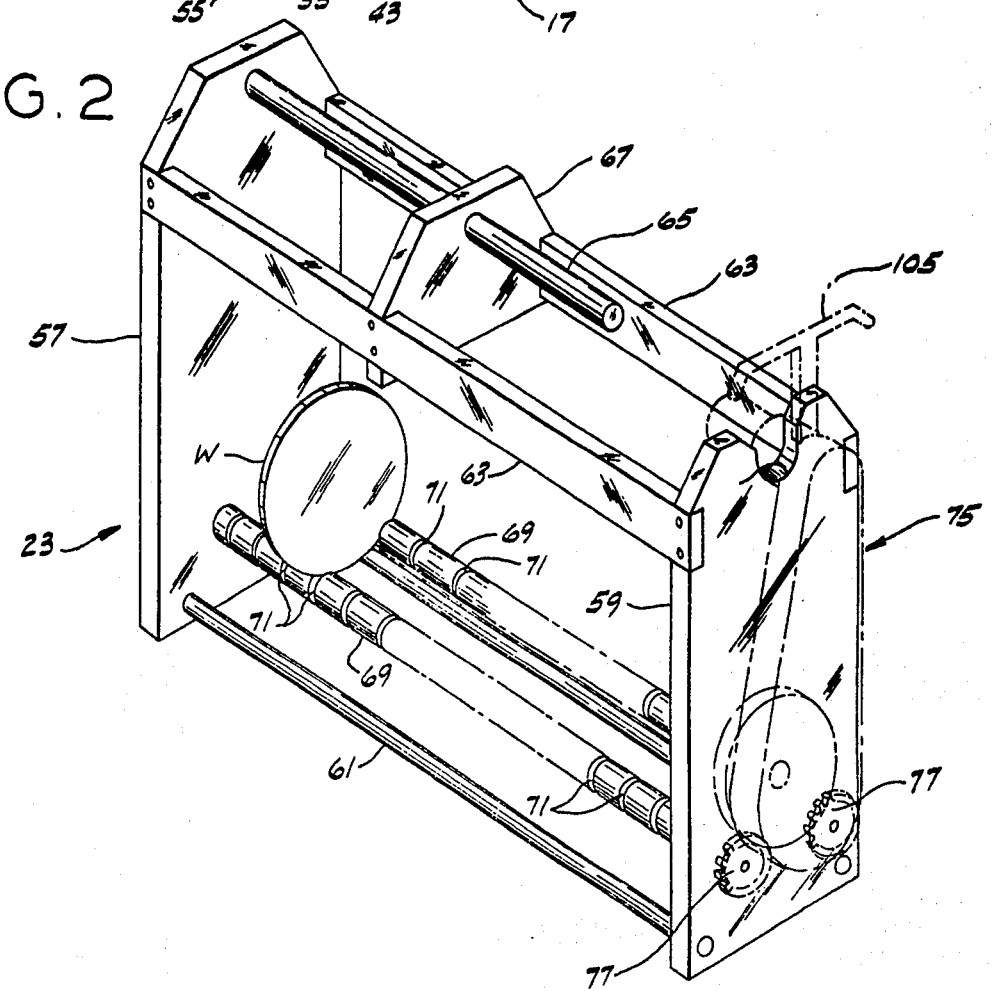
FIG. 2 is a perspective view of a wafer rack forming part of the apparatus of the invention.

Referring now to FIG. 2 and 3, a wafer rack 23 of the invention is also constructed of polypropylene components. Rack 23 includes end pieces 57 and 59 constituting part of the frame. The end pieces 57 and 59 are maintained in rigid, spaced relationship by a pair of dowel rods 61 at the lower portions thereof and by a pair of bar members 63 secured to the upper portions of these end pieces. Another length of rod 65 extending from end piece 57 and through a cross-piece 67 carried between bar members 63 provides a handle for raising and lowering the wafer rack into etching chamber 25. A pair of elongate rollers 69 have their respective ends journalled in the frame end pieces 57 and 59 so as to be freely rotatable. Thus it will be seen that when wafer rack 23 is lowered into etching chamber 25 (FIG. 1), the rollers are horizontal and it will be seen that the respective longitudinal axes of said rollers are in spaced, parallel relationship. Each of rollers 69 has a plurality of annular grooves 71 spaced along the length of each of the rollers. Grooves 71 of one of the rollers are laterally aligned with respective grooves 71 of the other of the rollers so that each such laterally aligned pair of grooves will support a wafer W, i.e., a slice of silicon, such that the edges of the wafer are carried in grooves 71 in contact therewith. Thus it will be understood that a plurality of wafers W are supported vertically by their edges in vertical face-to-face relationship. The wafers are rotated by the rollers during etching by an arrangement which is described below.

FIG. 4 illustrates, in enlarged detail, a first groove configuration which may be employed. This configuration is preferred in order minimize wearing of the grooves by the wafers therein. This groove configuration may be referred to as U-shaped. This groove cross-section is seen to be defined by a pair of vertical surfaces 71a, 71a' spaced apart by a distance slightly greater than the thickness of wafer W. These vertical surfaces merge into a U-shaped surface 71b at the bottom of groove 71. Peripheral edges WE of the wafer contact opposite sides of surface 71b. It will also be apparent that the opening of the groove is defined by rounded shoulders 71c, 71c' which merge into vertical surfaces 71a, 71a', respectively. Another groove configuration is shown in FIG. 5. This groove cross-section is seen to be defined by a somewhat less deep pair of vertical surfaces 71d, 71d' spaced apart by a distance slightly greater than the thickness of wafer W. These vertical surfaces merge into a V-shaped surface 71e at the bottom of groove 71. The peripheral edges WE of the wafer contact opposites sides of surface 71e. It will also be noted that the groove opening is defined by respective shallow sloping faces 71f, 71f' which slope toward the vertical faces and which meet these vertical faces at a relatively abrupt edge. This configuration, which may be referred to as of V-shape, while providing excellent friction with wafers therein when the wafers are rotated by rotation of the roller 69, may tend to wear at the bottom and become rounded out during use.

It will be apparent from FIGS. 1 and 2 that the spacing between the longitudinal axes of the rollers is substantially greater than the radius of a wafer W. Preferably, the contact angle of the rollers as defined by the included angle between the radii of the wafer at the points of contact of the wafer with the respective grooves of the rollers is approximately 110°. Referring to FIG. 6, the center of a wafer W is indicated at C such that the wafer has a radius $R_s$. Each of the rollers 69 has a radius $R_r$ with the groove 71 of each roller 69 having a depth $d$. The longitudinal axes of rotation of each of rollers 69 is indicated at 73 and the lateral spacing between these axes is designated $l$. It will be seen that where the slice diameter is designated $D_s$ and the roller outside diameter is designated $D_r$ and where said contact angle is designated $\alpha$, the following relationships may be obtained:

$$l = \sin \frac{\alpha}{2}(D_s + D_r - 2d) \qquad (4)$$

$$\alpha = 2 \arcsin \left( \frac{l}{D_s + D_r - 2d} \right) \qquad (5)$$

Preferably, the contact angle is approximately 105°–115°. The following table illustrates specifically preferred contact angles for various nominal wafer diameters and for two roller groove depths:

| $D_s$ NOMINAL WAFER DIA. (IN.) | $l$ ROLLER SPACING (IN.) | NOMINAL CONTACT ANGLE FOR $D_r =$ 0.625 IN. $d = .080$ IN. (DEG.) | NOMINAL CONTACT ANGLE FOR $D_r =$ 0.75 IN. $d = 0.10$ IN. (DEG.) |
|---|---|---|---|
| 1.50 | 1.624 | 111.5 | 105.0 |
| 1.75 | 1.841 | 112.5 | 106.5 |

*-continued*

| $D_s$ NOMINAL WAFER DIA. (IN.) | 1 ROLLER SPACING (IN.) | NOMINAL CONTACT ANGLE FOR $D_r$= 0.625 IN. d = .080 IN. (DEG.) | FOR $D_r$= 0.75 IN. d = 0.10 IN. (DEG.) |
|---|---|---|---|
| 2.00 | 2.057 | 113.0 | 107.5 |
| 2.25 | 2.273 | 113.5 | 108.5 |
| 2.50 | 2.490 | 114.0 | 109.5 |
| 2.75 | 2.707 | 114.5 | 110.0 |
| 3.00 | 2.923 | 115.0 | 111.0 |
| 3.25 | 3.140 | 115.5 | 111.5 |

Those who are familiar with the processing of wafers of silicon, such as those sliced from Czochralski-grown boules of monocrystalline silicon, will know that cylinders of silicon which are ground from a grown boule have a so-called flat area ground along the length of the cylinder in order to provide predetermined crystallographic orientation of wafers which are sliced from the ground cylinder. Such flats have an average chord depth of 0.080 inches. It is found that such flats do not cause jamming of the wafers during rotation thereof when using dimensions according to the foregoing table.

If the spacing between grooves 71 along each of the rollers 69 is too close, the wafers supported by the grooves will be spaced too closely causing a tendency for the top edges of the wafers to pull together. This may cause the slices to be pulled out of the grooves. In addition, wafers which are too closely spaced may exhibit uneven stock removal during etching and may result in thin edges. In order to avoid such problems, the following table shows the preferred spacing between adjacent grooves 71 for various nominal slice diameters:

| $D_s$ NOMINAL WAFER DIAMETER (IN.) | S ADJACENT GROOVE SPACING (IN.) |
|---|---|
| 1.50 | 0.400 |
| 1.75 | 0.400 |
| 2.00 | 0.400 |
| 2.25 | 0.500 |
| 2.50 | 0.600 |
| 2.75 | 0.750 |
| 3.00 | 0.857 |
| 3.25 | 1.000 |
| 3.50 | 1.091 |
| 3.75 | 1.333 |
| 4.00 | 1.500 |
| 4.25 | 1.710 |

A removable drive assembly indicated generally at 75 is utilized for causing rotation of rollers 69 and thereby rotation of the wafers supported in the grooves of the rollers. As will be seen from FIG. 2, each of the rollers 69 carries a gear 77 attached to an extension of each roller, each such gear 77 adapted to be driven by the removable drive unit 75, which includes a toothed drive gear 79, the teeth of which are adapted to mesh with the teeth of gears 77. Hence it will be seen that both of rollers 69 are adapted to be driven for rotation in the same direction.

Drive assembly 75 includes a hermetically sealed housing 81 adapted for immersion in the acid etchant. Housing 81, like other portions of wafer rack 57 and etchant tank 11 is preferably of polypropylene construction. Housing 81 contains at its upper end an electric motor 83 which turns a drive sprocket 85. A suitable belt 87 connects drive sprocket 85 with a driven sprocket 89. A plurality of magnets such as indicated at 91 and 93 are carried by driven sprocket 89 which is journalled for rotation as indicated at 95 within housing 81. Gear 79 is journalled for rotation exteriorly of housing 81 on a shaft 97 extending from housing 81 coaxially with the axis of rotation of driven sprocket 89. Gear 79 includes a plurality of magnets 99 and 101 which are magnetically coupled to the magnets 91 and 93 carried by sprocket 89. It will be seen that sprocket 89 constitutes a drive rotor and gear 79 constitutes a driven rotor with the drive rotor being magnetically coupled to the driven rotor for causing rotation of the latter.

Referring to FIG. 2, end piece 59 of wafer rack 23 is notched as indicated at 103 in order to receive that portion of drive assembly housing 81 which contains motor 83. Thus the drive assembly can be mated to the wafer rack 23 either before or after the rack is immersed in the etchant with its load of wafers. The housing 81 includes a handle 105 for facilitating this operation. Means is indicated at 107 for connecting the motor 83 to a source of electric power. During an etching run, the direction of motor 83 is preferably periodically reversed to reverse the direction of rotation of the wafers. For slices with diameters in the range of two to three inches, the optimum wafer rotation rate has been determined to be $S_s = 39.3 (D_s)^{-1/2}$ where $S_s$ is the slice or wafer rotation speed in RPM and $D_s$ is the wafer diameter.

In operation of the apparatus, it is preferred to use an etchant having a composition as follows:
57 parts by volume - 70% $HNO_3$
18 parts by volume - 50% HF
25 parts by volume - glacial acetic acid ($CH_3COOH$), specific gravity approximately 1.29.

In use, the apparatus is filled with etchant to a proper level and the etchant is then heated by heating coils 55 until it reaches a proper temperature such as 85°F. as noted previously. Etching rack 23 is then loaded with the desired number of wafers W whose thickness is first measured and the etchant rack together with drive unit 75 are then immersed in the etchant. At the same time, a suitable timer which is first set to a predetermined etching cycle time, is started. When the timer signals completion of this predetermined period of time, wafer rack 23 is then removed from tank 11 and any etchant remaining on the wafers is then removed by means of a water quench and rinse. The wafers are then removed from rack 23, dried and inspected. The wafer thickness is then remeasured.

In use of a prototype apparatus as herein described, it has been found that wafers can be accurately and precisely etched to a predetermined thickness. It has been found that using the precision etching methods as herein described, etched slice yields can be obtained in the range of 96 to 93 per cent and such yields were obtained in prototype operation for a number of slices of two inch and three inch diameter.

It has also been found that improved edgerounding is imparted by precision etching according to the present disclosure. Such edgegrounding was found to depend on the amount of wafer stock which is etched away and also upon the depth and shape of the roller grooves 71. With a roller groove configuration as shown in FIG. 4, the surface thickness if found to roll off beginning gradually at about 50 mils from the wafer edge. It increases exponentially as the edge is approached. About 80 to 90 per cent of the roll-off is in the outer 30 mils and 50 per cent or more of it is in the outer 10 mils. In comparison, wafers which were etched using the prior art technique of bucket etching start to roll-off 200–500 mils from the edge with only about 50 per cent of the roll-off in the outer 30 mils and 25 per cent in the outer 10 mils.

Typical edgerounding values as measured from slices etched according to the present disclosure are as follows:

| Etching Stock Removal (mils) | Edgerounding (micro-inches) |
| --- | --- |
| 2.0 | 800 |
| 2.5 | 1000 |
| 3.0 | 1200 |
| 4.0 | 1400 |

These values refer to the depression of the wafer edge below the general surface plane.

Another advantage which has been found to accrue in use of the present invention is reduced wafer staining. In prior art processes, special quenching baths were needed which contained $I_2$, IBr, mixed etchant or acetic acid in order to prevent severe staining. In using the present invention, severe staining is not encountered.

The precision etching process presently described is also found to reduce acid usage, to provide much-increased wafer thickness uniformity, to minimize scratch damage through wafer contact during and after etching, to reduce peak loads on fume scrubbing equipment, and to prevent excessive dilution of spent etchant. Most importantly, the precision etching process herein described is believed to provide for the first time the capability of etching sawed or lapped wafers to close thickness tolerances even though the starting thickness distribution may be very broad. This capability makes it practical to eliminate lapping in the process of polishing silicon wafers for ultimate use in integrated circuit devices. This has permitted an increase in polishing yield and reduction in the manual labor usually associated with such polishing processes.

In view of the foregoing, it will be seen that the several objects of the invention are achieved and numerous other advantageous results are obtained.

As various changes could be made in the methods and constructions herein described without departing from the scope of the invention it is intended that all matters contained in the above description or shown in the accompanying drawings shall be interpreted as illustrative and not in a limiting sense.

What is claimed is:

1. Apparatus for uniform, damage-free chemical treatment of a plurality of generally circular wafers, said wafers each having substantially the same diameter, said apparatus comprising a frame adapted for being immersed in a chemical medium for treating said wafers, said frame including a pair of opposed end pieces, a pair of elongate rollers each extending longitudinally between said end pieces, each of said rollers having its respective ends journalled for rotation in said end pieces, said rollers being horizontal, the respective longitudinal axes of said rollers being in spaced, parallel relationship, each of said rollers having a plurality of annular grooves spaced uniformly along the length of the roller, grooves of one roller being laterally aligned with corresponding grooves of the other roller to provide parallel pairs of laterally aligned grooves, each of said grooves being of sufficient depth and of a crosssection shaped such that each laterally aligned pair of grooves is adapted to provide the sole means for guiding and supporting said wafers in a vertical plane, the spacing between the longitudinal axes of said rollers being substantially greater than the diameter of said wafers, the contact angle of said rollers defined by the included angle between the radii of said wafers at the points of contact of said wafers with the respective grooves of said rollers being approximately 105° to 115°, said laterally-aligned grooves thereby supporting a plurality of said wafers in spaced, parallel relationship, and means for driving at least one of said rollers whereby the driven roller causes rotation of each of said wafers while said wafers are maintained in said spaced, parallel relationship while immersed in said chemical medium and whereby said wafers are prevented from being contacted by each other or by other objects except the surfaces of said grooves.

2. Apparatus for chemical treatment of circular wafers as set forth in claim 1 wherein said means for driving at least one of said rollers comprises a first rotatable magnet means operatively associated with the last-said roller for causing rotation of said roller when said first magnet means is rotated, a second rotatable magnet means adapted for being magnetically coupled to said first magnet means, and a source of motive power for rotating said second second magnet means when magnetically coupled to said first magnet means, whereby magnetic coupling between said first and second magnet means causes rotation of said roller when said second magnet means is rotated by said source of motive power.

3. Apparatus for chemical treatment of circular wafers as set forth in claim 1 wherein said means for driving at least one of said rollers comprises a toothed wheel carried by said roller and a drive assembly for removable engagement with said toothed wheel including a housing hermetically sealed to said medium and adapted for at least partial immersion in said medium, said housing containing within it an electric motor and a drive rotor adapted to be driven by said motor, said drive rotor having magnet means, a tooth drive gear rotatably secured to an outside surface of said housing for engaging teeth of said toothed wheel, said drive gear having magnet means magnetically coupled to the magnet means of said drive rotor, whereby rotation of said drive rotor causes rotation of said drive gear for rotation of said wafers.

4. Apparatus for chemical treatment of circular wafers as set forth in claim 1 wherein the cross-section of each of said grooves is defined by a pair of vertical surfaces spaced apart by a distance slightly greater than the thickness of each of said wafers, said vertical surfaces merging in to a U-shaped surface at the bottom said groove, the peripheral edges of said wafers contacting opposite sides of said U-shaped surface, the opening of each of said grooves being defined by respectively rounded shoulders merging into said vertical surfaces.

5. Apparatus for chemical treatment of circular wafers as set forth in claim 1 wherein the cross-section of each of said grooves is defined by a pair of vertical surfaces spaced apart by a distance slightly greater than the thickness of each of said wafers, said vertical surfaces merging into a V-shaped surface at the bottom of said groove, the peripheral edges of said wafers contacting opposite sides of said V-shaped surface.

6. Apparatus for uniform, damage-free precision chemical etching of a plurality of generally circular wafers, said wafers each having substantially the same diameter, said apparatus comprising an etchant tank for containing a body of liquid etchant, a frame adapted for being immersed in said etchant, said frame including a pair of opposed end pieces, a pair of elongate rollers each extending longitudinally between said end pieces, each of said rollers having its respective ends journalled for rotation in said end pieces, said rollers being horizontal, the respective longitudinal axes of said rollers being in spaced, parallel relationship, each of said rollers having a plurality of annular grooves spaced uniformly along the length of the roller, grooves of one roller being laterally aligned wih corresponding grooves of the other roller to provide parallel pairs of laterally aligned grooves, each of said grooves being of sufficient depth and of a cross-section shaped such that each laterally aligned pair of grooves is adapted to provide the sole means for guiding and supporting one of the wafers, the spacing between the longitudinal axes of said rollers being substantially greater than the the diameter of said wafers, said laterally aligned grooves thereby supporting a plurality of said wafers in spaced, parallel relationship, means for rotating said rollers whereby rotation of said rollers causes rotation of each of said wafers while said wafers are maintained in said spaced, parallel relationship while immersed in said etchant and whereby said wafers are prevented from being contacted by each other or by other objects except the surfaces of said grooves, means for circulating the etchant for causing uniform flow of the etchant through the spaces between said wafers, heat exchanger means for maintaining the etchant substantially at a predetermined temperature, and means for metering fresh etchant into said body of etchant.

7. Apparatus for precision chemical etching of wafers as set forth in claim 6 wherein said means for circulating etchant comprises a sparger.

8. Apparatus for precision chemical etching of wafers as set forth in claim 7 wherein said sparger comprises a sparging tube having apertures therein for release of gas, and means for supplying gas to said sparging tube, said sparging tube being positioned within said tank for causing gas bubbles released from said sparging tube to rise in said body of etchant, said rising gas bubbles causing circulation of said etchant.

9. Apparatus for precision chemical etching of wafers as set forth in claim 7 wherein said heat exchanger means comprises means for circulating a coolant fluid in heat exchange relationship with said body of etchant.

10. Apparatus for precision chemical etching of wafers as set forth in claim 9 wherein said heat exchanger means further comprises heater means in heat exchange relationship with said body of etchant.

11. Apparatus for precision chemical etching of wafers as set forth in claim 6 wherein said tank comprises an etching compartment adapted for containing said wafer rack, a heat exchange compartment containing said heat exchanger means, and a sparging channel contaning a sparger for circulating the etchant.

* * * * *